United States Patent [19]
Peterson et al.

[11] Patent Number: 5,754,726
[45] Date of Patent: May 19, 1998

[54] OPTICAL DEVICE ASSEMBLY USED FOR FASTENING TO PC BOARDS

[75] Inventors: Gary Edward Peterson, Schaumburg; Janice Marie Weber, Elgin, both of Ill.

[73] Assignee: Motorola, Inc., Schaumburg, Ill.

[21] Appl. No.: 656,617

[22] Filed: May 31, 1996

[51] Int. Cl.$^6$ ............................ G02B 6/00; H01S 3/00
[52] U.S. Cl. ...................... 385/147; 385/146; 372/109
[58] Field of Search ........................ 385/88, 89, 129, 385/130, 134, 146, 147, 901; 372/43, 50, 109

[56] References Cited

U.S. PATENT DOCUMENTS

| | | | |
|---|---|---|---|
| 3,578,973 | 5/1971 | Dooley et al. | 385/147 X |
| 3,924,954 | 12/1975 | Decret et al. | 385/147 X |
| 4,767,172 | 8/1988 | Nichols et al. | 385/146 X |
| 4,824,194 | 4/1989 | Karasawa | 385/146 X |
| 4,863,229 | 9/1989 | Yasui | 385/147 X |
| 5,093,890 | 3/1992 | Bregman et al. | 385/146 |
| 5,257,331 | 10/1993 | Shapir | 385/25 |

*Primary Examiner*—Brian Healy
*Attorney, Agent, or Firm*—Susan L. Lukasik

[57] ABSTRACT

An assembly (100) for one or more optical devices (101) includes a first bar (105) on which the optical devices (101) are attached. One or more legs (109) are attached to the first bar (105) to aid the assembly in fastening to a printed circuit board (801). Pegs (111) and/or stabilizers (113) may be added to more firmly secure the assembly (100) to the PC board (801).

18 Claims, 2 Drawing Sheets

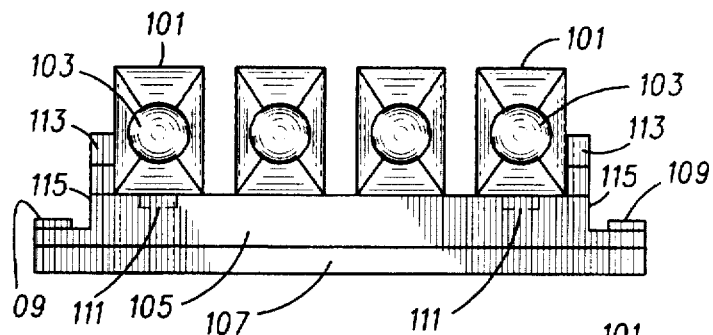
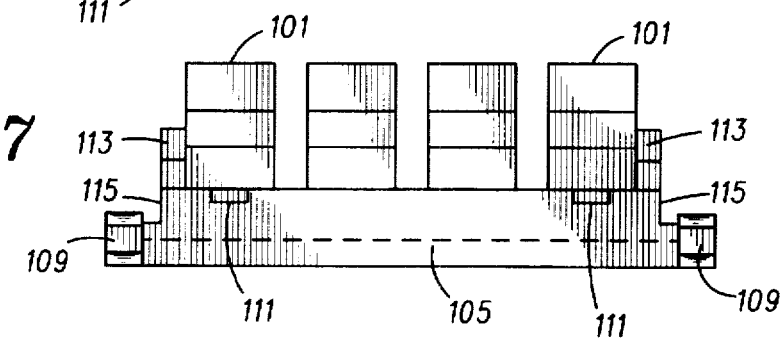
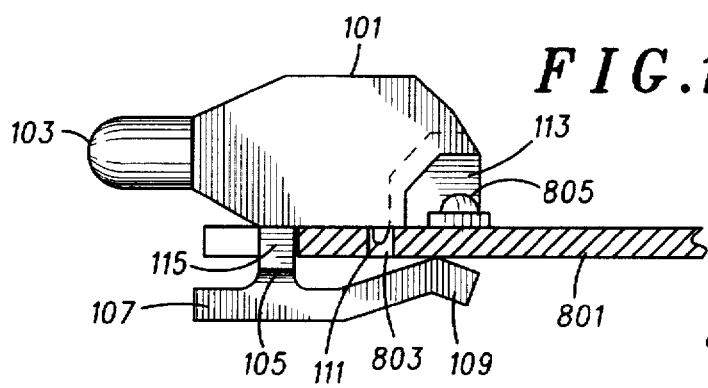
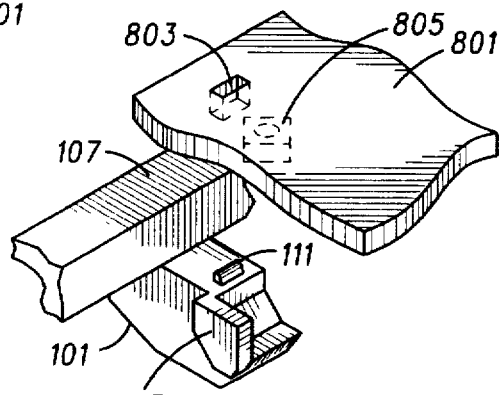
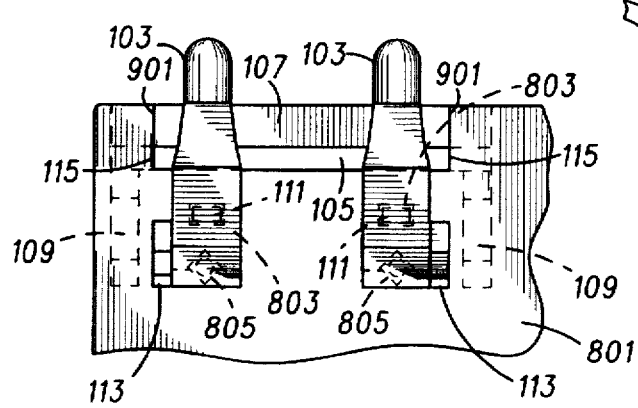

OPTICAL DEVICE ASSEMBLY USED FOR FASTENING TO PC BOARDS

FIELD OF THE INVENTION

This invention relates to component mounting, including but not limited to apparatus for and methods of fastening components to printed circuit (PC) boards.

BACKGROUND OF THE INVENTION

Many electronic devices, such as computers, stereos, receivers, base stations, and so forth, have holes in their front panels through which light bulbs or, more typically, light emitting diodes (LEDs) emit light as indications of various pieces of information to the user. Usually, these LEDs are attached to a PC board that is parallel to the front panel of the electronic device. Nevertheless, some electronic devices are oriented such that PC boards are mounted perpendicular to the front panel of the electronic device, and consequently, the LEDs must be attached at a right angle to the board to provide visualization of the LED when it is on. In other words, the LED must emit light in a direction parallel to the plane of the surface of the PC board on which the LED is attached.

Right angle LEDs and other piece parts have been successfully mounted using mounting leads that are fed into through-holes in the PC board. Through-hole mounting may not be compatible with factory processes exclusively using newer surface mount technology. Surface mounted devices are mounted to the surface of the board without using leads that go through holes in the surface of the board. As an example, a surface-mount part, such as a transistor, may have two or more points of attachment to the PC board. The PC board has solder paste in the position on the board where the attachments will meet the PC board. The part is placed in the proper place on the PC board, with adhesive. When all the parts are on the PC board, the PC board is run through a solder reflow process that melts the solder paste, thereby forming, upon cooling, connections between the PC board and the part.

Currently available right angle surface mount LEDs are typically not as reliable as subminiature surface mount LEDs. Currently available subminiature surface mount LEDs are not, however, available in right angle versions. Subminiature surface mount LEDs emit light perpendicular to the plane of the PC board. When LEDs are used as indicator lights, they must be visible through the front panel of the electronic device when mounted on a PC board within the electronic device. Thus, if a subminiature LED is used, a method must be provided to bend the light 90 degrees so as to be emitted parallel to the surface of the PC board.

Lightpipes are known in the art. Typically, a light source is directed into surfaces of the lightpipe and out the front lens of the lightpipe to provide a light indicator that would be visible through the front panel of an electronic device. Very few right angle lightpipes exist, wherein light from the surface of a board is reflected through the lightpipe and out the lightpipe lens at an angle parallel to the surface of the board. Moreover, these lightpipes are not surface mountable, because they are typically made of optical plastics such as polycarbonate or acrylic and would melt if subjected to temperatures of the reflow process that surface mounts devices to the PC board.

Accordingly, there is a need for a method of mounting an optical device on a printed circuit board efficiently such that the optical device may be precisely mounted to capture the light and efficiently bend it in a direction parallel to the PC board with little chance for manufacturing error.

BRIEF DESCRIPTION OF THE DRAWINGS

FIG. 6 is a front view of an optical device assembly in accordance with the invention.

FIG. 7 is a rear view of an optical device assembly in accordance with the invention.

FIG. 8 is an isometric view of an optical device in relation to a PC board in accordance with the invention.

FIG. 9 is a top view of an optical device assembly fastened to a PC board in accordance with the invention.

FIG. 10 is a side view of an optical device assembly fastened to a PC board in accordance with the invention.

DESCRIPTION OF A PREFERRED EMBODIMENT

Figure 1:
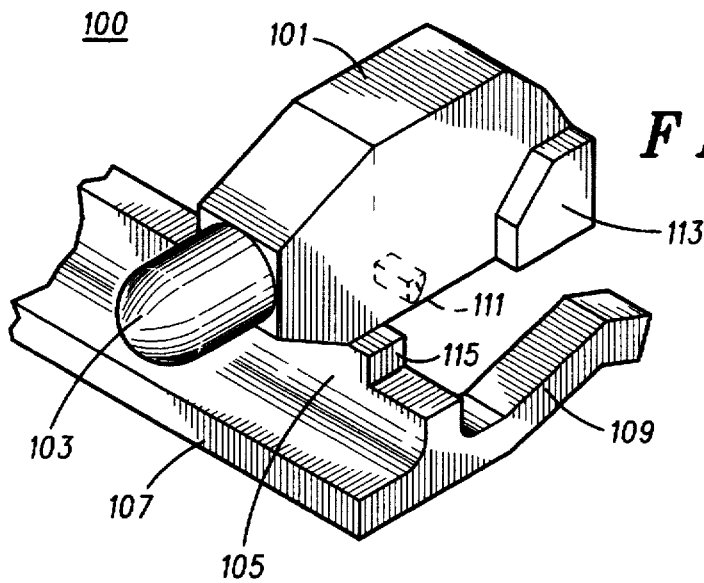
FIG. 1 is an isometric view of an optical device assembly in accordance with the invention.

The following describes an assembly/apparatus and method of mounting one or more optical devices to a PC board at a right angle to the surface of the PC board. The optical devices are mounted in parallel on a brace composed of one or more bars perpendicular to the bottom surface of the optical device. Mounting clips or legs are attached to the brace. The optical devices rest on the top surface of the PC board near an edge of the PC board, which edge rests against the brace. The mounting clips or legs press against the bottom surface of the PC board, to help keep the optical device assembly firmly fastened to the PC board. The position of the optical device(s) on the surface of the PC board is controlled by a peg on the bottom of one or more of the optical devices, which pegs drop into mating slots on the PC board. In the preferred embodiment the position of the optical device(s) is also controlled by a cutout in each end of a bar. The cutouts slide into and are captured by a mating cutout in the PC board. In addition, stabilizing elements may also be attached to the optical devices to provide a more stable resting position for the optical devices on the PC board. In the preferred embodiment, the optical devices are right-angle lightpipes. Each lightpipe collects light from an LED mounted on the surface of the PC board and redirects the light through a 90° angle by means of angled surfaces out through the lightpipe lens. When the LEDs are on, the light is reflected through the lightpipe and out through the hole in the front panel of the electronic device in which the PC board is mounted.

An apparatus that mounts to a board having a top plane and a bottom plane comprises at least one optical device having a bottom surface. A member has a first side, a second side, and a third side. The first side is attached to a portion of the bottom surface of the at least one optical device. At least one leg has an upper surface. The at least one leg is attached to a portion of the second side of the member, such that at least a portion of the bottom surface of the at least one optical device is in contact with a portion of the top plane of the board and the upper surface of the at least one leg is in contact with a portion of the bottom plane of the board.

In addition, a branch may be attached to the third side of the member, such that the branch and the member form an L-shape. Further, at least one peg may be attached to the at least one optical device such that the at least one peg is parallel to the member. The apparatus may further comprise at least one stabilizer having a bottom surface, wherein the at least one stabilizer is attached to a side of at least one of the at least one optical device, wherein the bottom surface of the at least one stabilizer is in a same plane as the bottom surface of the at least one of the at least one optical device. The at least one optical device may be a right-angle lightpipe, and the right-angle lightpipe may collect light from a light emitting source mounted on the top plane of the board and redirect the light through a 90 degree angle via angled surfaces of the lightpipe and through a lens of the lightpipe. The at least one leg may be slightly flexible. The leg may be comprised of a first segment, perpendicular to the second side of the member; a second segment, attached to the first segment and set at a first angle to the first segment; and a third segment, attached to the second segment and set at a second angle to the second segment, wherein the first segment, the second segment, and the third segment occupy a plane perpendicular to the second side of the member. Further, the member may comprise at least one cutout, wherein the at least one cutout has an edge perpendicular to the first side of the member, such that the edge mates to a cutout in the board to prevent motion of the apparatus along the direction of the member when the apparatus is fastened to the board.

A diagram of a optical device assembly 100 is shown in FIG. 1. One or more optical devices 101 having a lens or dome 103 are mounted to a first bar 105 at a perpendicular angle. The first bar 105 is a long rectangular member with four sides, and the optical devices 101 are attached to the top side of the first bar 105. In the preferred embodiment, a cut-out having an edge 115 is present in each end of the first bar. The edge 115 of each cut-out is perpendicular to the top side of the first bar 105. The edge 115 of the cutout mates with a cut-out on a PC board when the assembly 100 is fastened to the PC board, as will be described below with respect to FIG. 9. Parallel to the first bar 105 and attached to the first bar is a second bar 107, which provides stability and strength to the assembly 100 through the L-shaped relation between the first bar 105 and the second bar 107. The first bar 105 and the second bar 107 provide a brace on which the optical devices 101 are attached. In the preferred embodiment, the assembly 100 is slid into position on the PC board when pressure is applied to the second bar 107. A clip or leg 109 is attached to the end of the first bar and is mounted parallel to the mounting of the optical device, such that a PC board rests between the optical device 101 and the clip 109, as will be described below with respect to FIG. 9 and FIG. 10.

Attached to the underside of the optical device 101 is a peg 111. The peg 111 extends outward and below the bottom surface of the optical device. The peg 111 fits in a slot on a PC board when the assembly 100 is fastened to the PC board, as will be described below with respect to FIG. 9 and FIG. 10. A stabilizer 113 is attached to the back portion of the side of the optical device 101. The bottom edge of the stabilizer 113 is parallel to and even with the bottom edge of the optical device 101. The stabilizer provides for stability of the assembly 100 in a direction normal to the surface of the PC board when the assembly 100 is mounted on the PC board.

Figure 2:
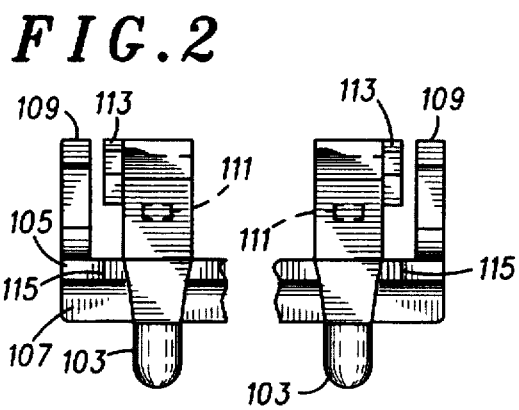
FIG. 2 is a top view of optical devices in an assembly in accordance with the invention.

A top view of the optical devices in an assembly 100 is shown in FIG. 2. In the assembly 100 of FIG. 2, two clips 109 are shown, one at each end of the first bar 105. Two or more optical devices 101 are attached to the first bar 105 between the clips. The assembly 100 is symmetrically arranged in the preferred embodiment, such that the clips 109 are on the outside of the assembly 100, and the stabilizers 113 are attached to the side of the optical device nearest the clip 109.

One or more optical devices 101 may be attached to the first bar 105. When two or more optical devices 101 are attached to the first bar 105, the optical devices 101 may be spaced close together or far apart, depending on the needs of the electronic device requiring the optical devices. In the preferred embodiment, the optical devices, which are lightpipes, are attached to the first bar 105 such that light from adjacent devices does not bleed from neighboring lightpipes, i.e., the lightpipes are connected such that the reflected light does not pass into a neighboring lightpipe instead of being reflected back into the lens of the lightpipe. In the preferred embodiment, the optical devices are right-angle lightpipes, although the invention may be successfully practiced in lightpipes with angles other than 90 degrees, backlit graphics devices, and keypad displays, and any application where a discrete light source is used and/or a non-perpendicular application is needed. In addition, the mounting process described herein may be used to mount other objects that need to be fastened to a PC board but may melt in a reflow process, such as internal or external connectors, front panels, switches, batteries, small speakers and microphones, and other plastic devices.

Figure 3:
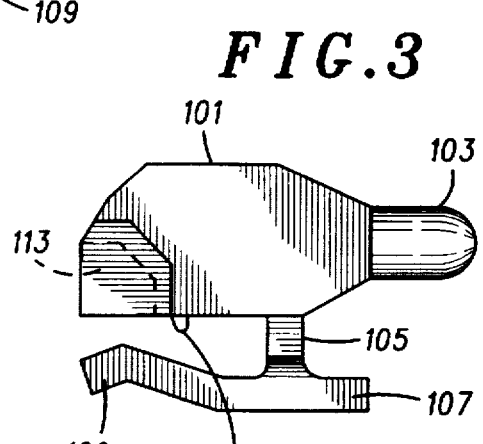
FIG. 3 is a side view of an optical device assembly in accordance with the invention.

A side view of an optical device 101 attached to the assembly 100 is shown in FIG. 3. One or more optical devices 101 are attached to the first bar 105, which has a second bar 107 parallel to and attached to the first bar 105 for the purpose of providing strength and stability to the first bar 105 and thus the entire assembly 100. In the preferred embodiment, the first bar 105 is attached to the bottom surface of the optical device(s) 101, thereby forming a right angle between the first bar 105 and the bottom surface of the optical device(s) 101. One or more clips or legs 109 are attached to the first bar 105, which clip extends in a direction parallel to the optical device 101. Optionally, one or more pegs 111 and/or stabilizers 113 may be added to more firmly secure the assembly 100 to the PC board.

Each leg 109, in the preferred embodiment, has three different segments, angled to one another. The first segment of the leg 109 attaches to the first bar 105 and is parallel to the second bar 107, such that the first segment of the leg 109, the first bar 107, and the second bar 105 form a T-shape. The middle segment of the clip is at an angle of 20 degrees to the first segment of the leg, which angle extends towards the bottom surface of the optical device 101. A third segment of the leg 109 extends from the middle segment downward and away from the bottom surface of the optical device 101. The joint between the middle segment and the third segment forms an edge or surface that touches the bottom surface of a PC board when the assembly 100 is fastened to the PC board. The shape of the legs 109 provides slightly flexible clips that bend so as to allow peg 111 to travel over the top surface of the PC board to reach the slot when assembly 100 is mounted to the PC board. The legs 109 are slightly flexible in that they bend enough to allow the assembly 100 to be mounted to a PC board without breaking, but not so flexible that the legs 109 are not able to touch the bottom of the PC board when peg 111 of the assembly 100 is resting in the slot on the PC board. Although the legs 109 have three angled segments in the preferred embodiment, other clips with fewer or more segments at the same or different angles may be successfully integrated into the assembly 100 as well.

Figure 4:
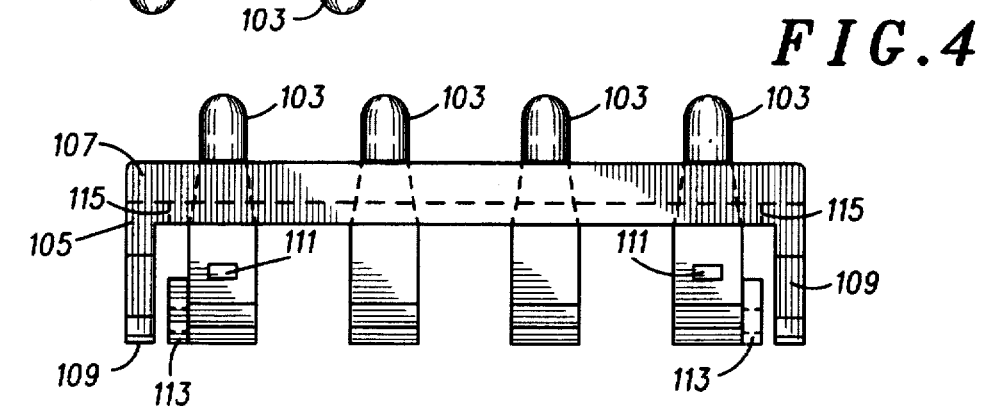
FIG. 4 is a bottom view of optical devices in an assembly in accordance with the invention.

A bottom view of the assembly 100 showing four optical devices 101 is shown in FIG. 4. In the preferred embodiment, a peg 111 is placed on each of the two outer optical devices 101 to provide stability when the assembly 100 is mounted to a PC board. If desired, although not necessary, each of the optical devices 101 may have a peg, but each peg 111 on the assembly 100 requires a hole or slot in the PC board. Also in the preferred embodiment, the stabilizer 113 is placed only on the two outer optical devices 101. Placing the stabilizers on the outer portion of the optical device prevents the stabilizer from affecting the optics of the adjacent optical devices, allows the devices to be more closely spaced thus requiring less area on the front panel, and provides the most stability for the assembly 100. In addition, by placing the pegs 111 and the stabilizers 113 only on the outer optical devices 101, tooling is saved, and the complexity of the assembly 100 is minimized, improving the likelihood of obtaining good quality in the manufactured assembly.

Figure 5:
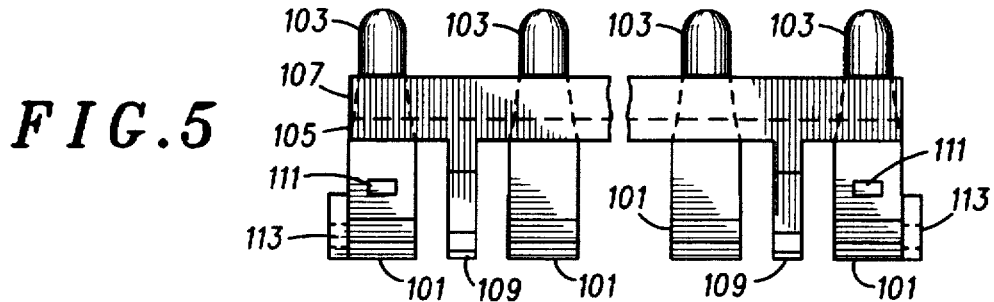
FIG. 5 is a bottom view of an optical devices assembly with clips to the inside of the optical devices in accordance with the invention.

A bottom view of the assembly 100 showing the legs or clips 109 in between the optical devices rather than on the outside of the optical devices 101 is shown in FIG. 5. The legs 109 of the assembly 100 may be placed between the optical devices 101, rather than outside them as shown in FIG. 5. This orientation of the legs 109 may be advantageous, for example, when the space in which the assembly 100 is to be mounted is limited on the outside of the optical devices. In this instance, the legs extend between the outer optical device 101 and the next adjacent optical device 101. The legs 109 may attach directly below (not shown) the optical devices 101, between them, or anywhere along the length of the first bar 105, as long as the assembly 100 is manufacturable and may be properly fastened to the PC board.

A front view of the assembly 100 having its clips 109 on the outside of the optical devices 101 is shown in FIG. 6. Although the drawings show only two legs or clips 109 in the assembly 100, more than two clips may be used to provide additional stability, for example when numerous optical devices 101 are attached to the first bar 105. A back view of the assembly 100 with four optical devices 101 is shown in FIG. 7.

A PC board 801 in relation to an optical device 101 is shown in FIG. 8. The PC board 801 has a hole or slot 803 placed in the PC board for each peg 111, such that the peg 111 from the optical device fits in the slot 803 when the assembly 100 is mounted to the PC board 801. An LED 805 (light emitting diode), subminiature surface mount LED, or other light emitting device is mounted to the PC board 801 such that when the assembly 100 is fastened to the board, the LED 805 illuminates the under surface of the optical device 101. In the preferred embodiment, a right-angle lightpipe is used, and the light from the LED 805 reflects through the surfaces of the lightpipe 101 and out the lens 103.

A top view of the assembly 100 attached to a PC board 801 is shown in FIG. 9. When the assembly 100 is mounted on the PC board 801, the bottom surface of the optical device 101 is parallel to and touches the top surface of the PC board 801. The peg 111, which sticks out below the bottom surface of the optical device, fits in a slot 803 on the PC board 801, which slot is designed to hold the peg 111. When the front edge of the PC board meets with the back edge of the first bar 105, the peg 111 fits in the slot 803 and prevents the assembly 100 from sliding along the surface of the PC board 801, thereby providing stability in the direction of the plane of the surface of the PC board 801. When the assembly 100 is fastened to the PC board 801, the edge 115 of the cutout mates with a cutout 901 in the PC board and prevents the assembly 100 from sliding in the direction parallel to the front edge of the board, thereby ensuring that the peg 111 meets the slot 803 and the optical device 101 is correctly positioned over the LED 805. When the legs or clips 109 are attached to the ends of the bar 105, the cutouts in each end of bar 105 allow for a smaller mating cutout 901 in the PC board 801 for assembly 100, thereby saving space for other surface mounted devices on the top side of the PC board. The LED 805 is mounted to the PC board 801 such that the LED 805 is immediately below the back end of the lower surface of the optical device 101 to provide a light source to the optical device 101 from the appropriate position. The clips 109 of the assembly 100 are below the PC board 801. The optical devices 101 are above the board, and the stabilizers 113 provide stability normal to the top surface of the PC board 801.

A side view of the assembly 100 attached to a PC board 801 is shown in FIG. 10. The front edge of the PC board 801, when mounted to the assembly 100, is flush against the first bar 105. The clip or leg 109 touches the bottom surface of the PC board 801, and the bottom surface of the optical device 101 is substantially flush to the top surface of the PC board 801. The peg 111 of the optical device 101 fits inside the slot 803 of the PC board. The LED 805 is surface mounted, in the preferred embodiment, to the top surface of the PC board 801, and fits in the cavity between the flat surface on the backside of the optical device 100 and the stabilizer 113. In the instance where the optical device 101 is not attached to a stabilizer 113, in other words, when the optical device is one of the optical devices in the assembly 100, the LED 805 is mounted below and fits inside the cavity of the back end of the optical device 101.

In the preferred embodiment, the assembly 100 is a single piece, made in an injection molding process. Each assembly containing a different number of optical devices is made from a unique mold or die. The plastic material enters the cavity of the die through the top surface of each optical device, which surface is parallel to the surface which rests on the PC board. In the preferred embodiment, the plastic is injected through the top surface of each optical device, rather than the dome of the lens or the sloped surfaces of the optical device where light is reflected, to prevent degradation of the optics of the device. In addition, texture is added to the die cavity that creates the dome of the device, which texture serves to diffuse the light. The dome allows the light emitted from the LED to be viewed from a larger viewing angle.

The present invention provides a method and apparatus for mounting an optical device on a printed circuit board efficiently such that the optical device may be precisely mounted to capture the light and efficiently bend it in a direction parallel to the PC board with little chance for manufacturing error. More particularly, the invention provides for a discretely placed subminiature surface mount LED to efficiently illuminate a large display area perpendicular to the PC board mounting plane without significant loss of light. Prior solutions utilized incandescent bulbs with many disadvantages. These bulbs were hot, fragile, through-hole wave soldered devices, which consumed large amounts of power, had a limited operational life, and needed to be filtered to obtain the right color of light output. LEDs larger than the subminiature variety cannot be reflowed reliably due to the large amount of encapsulating epoxy that delaminated the die. Such LEDs become fogged during a prolonged duration, high temperature soldering process typical of a reflow environment. This invention incorporates a post reflow assembled lightpipe, giving a right angle capability and larger viewing surface and angle to subminiature LEDs, avoiding all the issues associated with reflow. The discrete subminiature LED produces little heat, is very durable and automatically emits the proper color light.

What is claimed is:

1. An apparatus that mounts to a board having a top plane and a bottom plane, the apparatus comprising:

at least one optical device having a bottom surface;

a member, having a first side and a second side, wherein the first side is attached to the bottom surface of the at least one optical device;

at least one leg, having a surface, wherein the at least one leg is attached to a portion of the second side of the member, such that at least a portion of the bottom surface of the at least one optical device is in contact with a portion of the top plane of the board and the surface of the at least one leg is in contact with a portion of the bottom plane of the board.

2. The apparatus of claim 1, further comprising a branch attached to a third side of the member such that the branch and the member form an L-shape.

3. The apparatus of claim 1, further comprising at least one peg attached to the at least one optical device such that the at least one peg is parallel to the member.

4. The apparatus of claim 1, further comprising at least one cutout in the member, wherein the at least one cutout has an edge perpendicular to the first side of the member, such that the edge mates to a cutout in the board to prevent motion of the apparatus along the direction of the member when the apparatus is fastened to the board.

5. The apparatus of claim 1, further comprising at least one stabilizer having a bottom surface, wherein the at least one stabilizer is attached to a side of at least one of the at least one optical device, wherein the bottom surface of the at least one stabilizer is in a same plane as the bottom surface of the at least one of the at least one optical device.

6. The apparatus of claim 1, wherein the at least one leg is comprised of:

a first segment, perpendicular to the second side of the member;

a second segment, attached to the first segment and set at a first angle to the first segment;

a third segment, attached to the second segment and set at a second angle to the second segment, wherein the first segment, the second segment, and the third segment occupy a plane perpendicular to the second side of the member.

7. The apparatus of claim 1, wherein the at least one leg is slightly flexible.

8. The apparatus of claim 1, wherein the at least one optical device is a right-angle lightpipe.

9. The apparatus of claim 6, wherein the right-angle lightpipe collects light from a light emitting source mounted on the top plane of the board and redirects the light through a 90 degree angle via angled surfaces of the lightpipe and through a lens of the lightpipe.

10. An assembly that mounts to a board having a first plane and a second plane, the assembly comprising:

at least one device having a bottom surface;

a member, having a top side and a back side, wherein the top side is attached to a portion of the bottom surface of the at least one device;

at least one leg, having an edge, wherein the at least one leg is attached to a portion of the back side of the member such that at least a portion of the bottom surface of the at least one device is in contact with a portion of the first plane of the board and the edge of the at least one leg is in contact with a portion of the second plane of the board.

11. The apparatus of claim 10, further comprising a branch attached to a front side of the member such that the branch and the member form an L-shape.

12. The apparatus of claim 10, further comprising at least one peg attached to the at least one device such that the at least one peg is parallel to the member.

13. The apparatus of claim 10, further comprising at least one stabilizer having a bottom surface, wherein the at least one stabilizer is attached to a side of at least one of the at least one device, wherein the bottom surface of the at least one stabilizer is in a same plane as the bottom surface of the at least one of the at least one device.

14. The apparatus of claim 10, wherein the at least one leg is comprised of:

a first segment, perpendicular to the second side of the member;

a second segment, attached to the first segment and set at a first angle to the first segment;

a third segment, attached to the second segment and set at a second angle to the second segment, wherein the first segment, the second segment, and the third segment occupy a plane perpendicular to the second side of the member.

15. The apparatus of claim 10, wherein the at least one leg is slightly flexible.

16. The apparatus of claim 10, wherein the at least one device is a right-angle lightpipe.

17. The apparatus of claim 16, wherein the right-angle lightpipe collects light from a light emitting source mounted on the top plane of the board and redirects the light through a 90 degree angle via angled surfaces of the lightpipe and through a lens of the lightpipe.

18. The apparatus of claim 10, further comprising at least one cutout in the member, wherein the at least one cutout has an edge perpendicular to the top side of the member, such that the edge mates to a cutout in the board to prevent motion of the apparatus along the direction of the member when the apparatus is fastened to the board.

* * * * *